(12) United States Patent
French et al.

(10) Patent No.: US 6,481,527 B1
(45) Date of Patent: Nov. 19, 2002

(54) METHODS AND APPARATUS FOR ATTENUATING NOISE FROM A CABINET THAT HOUSES COMPUTER EQUIPMENT

(75) Inventors: F. William French, Littleton, MA (US); Paul Tirrell, Uxbridge, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/808,248

(22) Filed: Mar. 14, 2001

(51) Int. Cl.[7] ................................................ G41J 29/08
(52) U.S. Cl. ....................... 181/201; 181/198; 181/200; 181/202; 361/692
(58) Field of Search ................................ 181/201, 200, 181/202, 198; 361/689–695

(56) References Cited

U.S. PATENT DOCUMENTS

| | | | | | |
|---|---|---|---|---|---|
| 2,091,774 A | * | 8/1937 | Weiland | ...................... | 181/200 |
| 3,160,549 A | * | 12/1964 | Caldwell et al. | ......... | 428/317.3 |
| 4,109,749 A | * | 8/1978 | Sweet | ........................ | 181/230 |
| 4,522,283 A | * | 6/1985 | Smith | ......................... | 181/175 |
| 5,746,986 A | * | 5/1998 | Pollock et al. | .............. | 422/177 |
| 6,104,608 A | | 8/2000 | Casinelli et al. | ............ | 361/692 |
| 6,152,259 A | * | 11/2000 | Freist et al. | ................ | 181/290 |

* cited by examiner

Primary Examiner—Shih-Yung Hsieh
(74) Attorney, Agent, or Firm—Chapin & Huang, L.L.C.; David E. Huang, Esq.

(57) ABSTRACT

An apparatus attenuates noise from a cabinet that houses computer equipment. The apparatus includes a frame, a set of positioning members to position the frame relative to the cabinet, and lateral noise absorption members that are supported by the frame. The lateral noise absorption members define surfaces that form sides of airflow channels through the apparatus. The surfaces are substantially non-parallel to a direction of an airflow pathway through the cabinet when the set of positioning members positions the frame relative to the cabinet. The lateral noise absorption members absorb sound energy emanating from the cabinet (e.g., from a fan assembly within the cabinet). The lateral noise absorption members transform some of the sound energy into low level heat which can be dissipated into the air stream. Additionally, some of the sound energy is reflected back into the cabinet toward the source.

23 Claims, 6 Drawing Sheets

METHODS AND APPARATUS FOR ATTENUATING NOISE FROM A CABINET THAT HOUSES COMPUTER EQUIPMENT

BACKGROUND OF THE INVENTION

Some electronic cabinets store computer equipment such as circuit boards (e.g., processor boards, memory boards, networking boards, etc.), power supplies, disk drives, combinations thereof, and the like. A typical electronic cabinet has a fan assembly that moves air through an airflow pathway within the cabinet in order to remove heat generated by the equipment stored therein. Noise is a typical byproduct of the operation of the fan assembly. The amount of noise emanating from some fan assemblies, particularly from fan assemblies which include large fan motors or many fan motors, can be so substantial that the electronic cabinets storing those fan assemblies are not suitable for operating in an office environment.

Some businesses choose to locate electronic cabinets away from office areas in dedicated lab areas (e.g., separate rooms) so that the operation of the electronic cabinets does not interfere with the office areas. Often the lab areas provide a controlled environment (e.g., constant humidity and temperature, security, etc.) and provide convenient access to the cabinets (e.g., ceiling troughs and raised floors for power and network cables, space for adequate air circulation, etc.). Due to the large amount of noise typically emanating from the electronic cabinets in these areas, people who often spend a significant amount of time working in the vicinity (e.g., equipment operators, service technicians, etc.) typically wear earplugs or headphones to protect and preserve their hearing.

One electronic equipment manufacturer provides an electronic cabinet assembly having (i) a cabinet, (ii) a fan assembly located in the top of the cabinet, and (iii) a conventional noise muffling device that rests on top of the cabinet over the fan assembly in order to reduce noise emanating from the fan assembly. The noise muffling device is roughly a foot in height. The muffling device includes a grid of fiberglass padding and an outer steel housing that holds the grid over the fan assembly. A screened mesh retains the fiberglass in the grid configuration and prevents pieces of fiberglass from escaping into the air. The grid of fiberglass padding defines sets of flat sides which run parallel to the direction of the airflow pathway through the cabinet. When the fan assembly is in operation, some of the noise energy is absorbed by the grid of fiberglass thus reducing the amount of noise emanating from the cabinet.

SUMMARY OF THE INVENTION

Unfortunately, there are deficiencies to the above-described conventional muffling device. For example, in some situations, the muffling device does not adequately reduce noise emanating from the fan assembly. In particular, with the trend toward higher powered electronic components there comes the need for higher power airflow to cool those components. As such, the fan assemblies for many of the newer and larger cabinets generate such a significant amount of noise that the above-described conventional muffling device is no longer adequate to handle such situations.

Additionally, the height of the above-described conventional muffling device (e.g., roughly a foot) raises the profile of the cabinet assembly. The raised profile increases the required height of the ceiling in which the cabinet assembly resides, and may be less aesthetically pleasing than some conventional cabinet assemblies with lower profiles (e.g., conventional cabinet assemblies that do not have muffling devices).

Furthermore, the above-described conventional muffling device is rather heavy and expensive due to the steel housing that holds the fiberglass grid. The weight of the steel housing makes it difficult, particularly for shorter people, to install and remove the muffling device from the cabinet. The relative high cost of the steel housing may prohibit purchases of the muffling device even though the muffling device could substantially reduce the noise emanating from the cabinet assembly.

The above-described approach of using ear protection (e.g., earplugs or headphones) can provide effective protection to people working in the vicinity of the cabinet assembly. However, this approach cannot always be relied upon. For example, such ear protection items are cumbersome for a user to carry around, particularly if that user often enters and leaves the lab area, and are occasionally forgotten or not worn. Additionally, since such items are often construed as personal items and contact the user's ear and/or hair, such items typically are not shared among multiple users and thus are not always available to everyone. Rather, due to resource limitations (e.g., expense, inventory control, etc.), such items are often not made freely available to all people accessing the lab area, and people that access the lab area only occasionally are often made to endure the noise instead of being protected from it.

In contrast to the above-described conventional approach to reducing noise using a muffling device having a fiberglass grid that defines a set of flat sides running parallel to the direction of the airflow pathway through the cabinet, the invention is directed to techniques for attenuating noise from a computer equipment cabinet using lateral noise absorption members which define surfaces that form sides of airflow channels therethrough. The surfaces are substantially non-parallel to a direction of an airflow pathway through the cabinet when the lateral noise absorption members are properly installed with the cabinet. The invention provides more surface area (proportionately to height) and an improved angle of incidence for absorbing sound energy than the above-described conventional fiberglass padded device having flat sides that run parallel to the direction of the airflow pathway. Accordingly, the invention can provide substantial and superior ear protection particularly to people in the vicinity of the cabinet who do not have the benefit of other ear protection (e.g., earplugs, headphones, etc.).

One arrangement of the invention is directed to an apparatus for attenuating noise from a cabinet that houses computer equipment. The apparatus includes a frame, a set of positioning members to position the frame relative to the cabinet, and lateral noise absorption members that are supported by the frame. The lateral noise absorption members define surfaces that form sides of airflow channels through the apparatus. The surfaces are substantially non-parallel to a direction of an airflow pathway through the cabinet when the set of positioning members positions the frame relative to the cabinet. The lateral noise absorption members absorb sound energy emanating from the cabinet (e.g., from a fan assembly within the cabinet). The lateral noise absorption members transform some of the sound energy into low level heat which can be dissipated into the air stream. Additionally, some of the sound energy is reflected back into the cabinet toward the source (e.g., toward the fan assembly).

In one arrangement, the lateral noise absorption members include respective foam portions to absorb noise energy exiting the cabinet in the direction of the airflow pathway when the set of positioning members positions the frame relative to the cabinet. Foam is generally lower in cost and easier to handle (e.g., easier to cut and manually manipulate) than fiberglass thus making the apparatus of the invention less expensive and easier to make than the above-described conventional muffling device that has a fiberglass grid.

Preferably, the apparatus further includes longitudinal noise absorption members that extend in a direction that is perpendicular to the lateral noise absorption members, and each longitudinal noise absorption member defines slots that hold the lateral noise absorption members in position. The longitudinal noise absorption members provide additional surface area for absorbing sound energy for additional noise reduction.

In one arrangement, the foam portion of each lateral noise absorption member defines a substantially flat surface. The longitudinal noise absorption members include respective foam portions, and the foam portion of each longitudinal noise absorption member defines a substantially dimpled surface. One skilled in the art understands that such dimpled surfaces can improve attenuation of lower frequency sound energy. As such, the foam portions of the longitudinal noise absorption members tend to have an increased capability to absorb low frequency noise energy over that of the foam portions of the lateral noise absorption members. Accordingly, this arrangement has enhanced capabilities to absorb lower frequency sound energy.

In one arrangement, each lateral noise absorption member includes a foam portion, a metallic support portion (e.g., a flexible aluminum sheet), and adhesive that fastens the foam portion to the metallic support portion of that lateral noise absorption member. The metallic support portions provide structural support for the foam portions, as well as helps reflect any sound energy, which penetrates completely through the foam portions, back toward the sound energy source (i.e., the fan assembly).

In one arrangement, each lateral noise absorption member further includes another foam portion, and additional adhesive that fastens the other foam portion to another side of the metallic support portion of that lateral noise absorption member. Accordingly, any sound energy that could otherwise reflect off of the back of a lateral noise absorption member can thus be absorbed by the other foam portion to provide further noise reduction.

In one arrangement, the frame supports the lateral noise absorption members such that an edge of each lateral noise absorption member resides over an axis of rotation of at least one fan within the cabinet when the set of positioning members positions the frame relative to the cabinet. This placement of the lateral noise absorption members is in locations that provide little disruption of the airflow provided by the fans in order to avoid substantially interfering with the air stream.

In one arrangement, the longitudinal members orient the lateral noise absorption members such that the surfaces defined by the lateral noise absorption members reside at substantially 30 degrees to the direction of the airflow pathway through the cabinet when the set of positioning members positions the frame relative to the cabinet. This 30 degree orientation results in significant sound energy absorption (e.g., due to a substantially 60 degree angle of incidence for absorbing major sound energy components along the direction of the air stream) while still allowing the air stream to flow through the apparatus in order to remove heat from the equipment within the cabinet.

The features of the invention, as described above, may be employed in data storage systems, devices and methods and other computer-related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for attenuating noise from a cabinet that houses computer equipment using lateral noise absorption members which define surfaces that form sides of airflow channels. The surfaces are substantially non-parallel to a direction of an airflow pathway through the cabinet when the lateral noise absorption members are properly installed with the cabinet. The invention provides more surface area (proportionately to height) and an improved angle of incidence for absorbing sound energy than a conventional fiberglass padded device having flat sides that run parallel to the direction of the airflow pathway. Accordingly, the invention can provide substantial ear protection particularly to people in the vicinity of the cabinet who do not have the benefit of other ear protection (e.g., earplugs, headphones, etc.).

Figure 1:
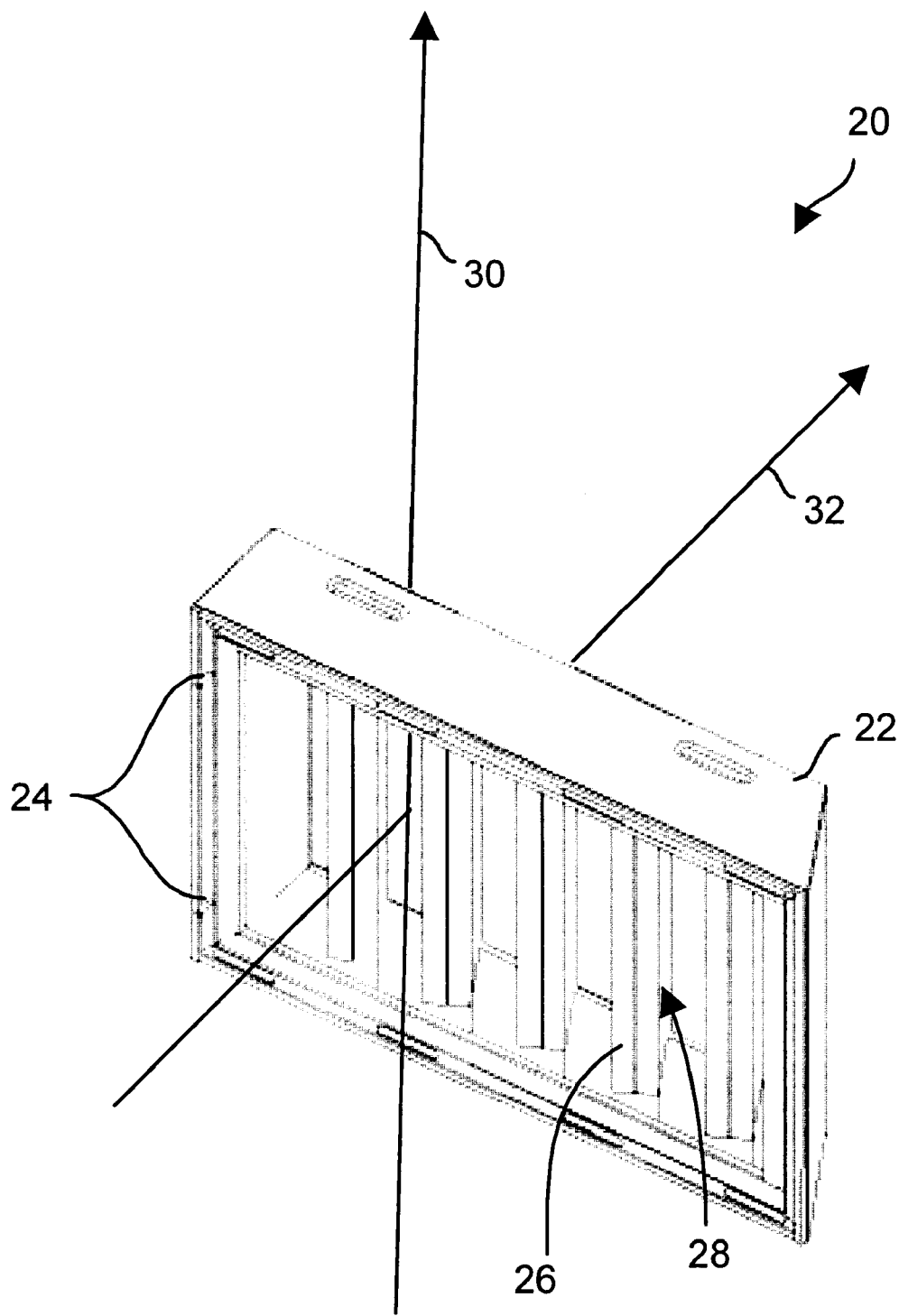
FIG. 1 shows a perspective view of an underside of an apparatus for attenuating noise which is suitable for use by the invention.

FIG. 1 shows an apparatus 20 which is suitable for use by the invention. The apparatus 20 includes a frame 22, a set of positioning members 24, and lateral noise absorption members 26 that are supported by the frame 22. The set of positioning members 24 positions the frame 22 relative to a cabinet (shown in subsequent figures) that houses computer equipment so that the apparatus 20 attenuates noise from the cabinet. The lateral noise absorption members 26 define surfaces 28 that form sides of airflow channels 30 through the apparatus 20. Additionally, the lateral noise absorption members 26 are configured in a louvered manner within the apparatus 20. In particular, the surfaces 28 of the lateral noise absorption members 26 are substantially non-parallel to a direction 32 of an airflow pathway through the cabinet when the set of positioning members 24 positions the frame 22 relative to the cabinet. Further details of the invention will now be described with reference to FIG. 2.

Figure 2:
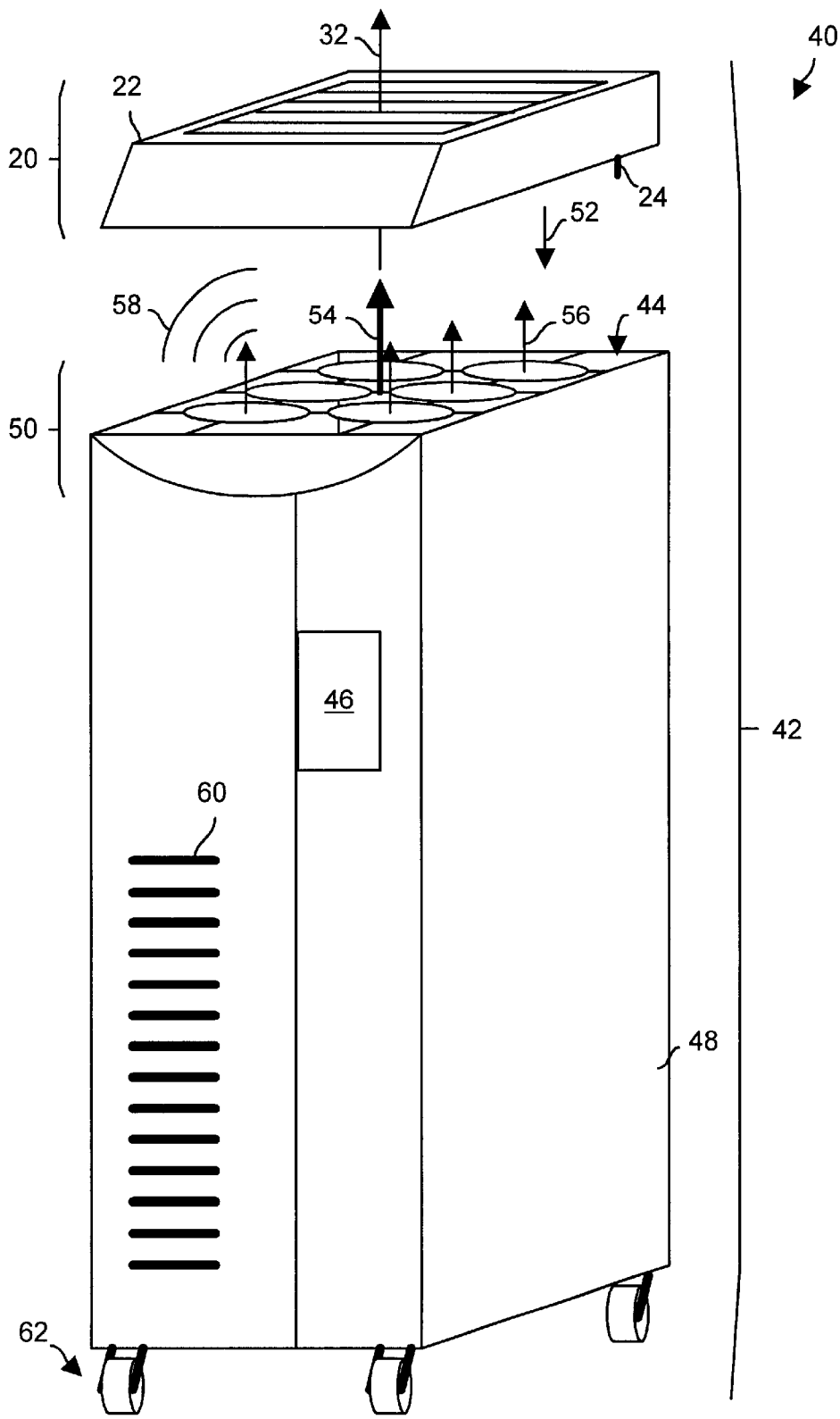
FIG. 2 shows a perspective view of a computer assembly which uses the apparatus of FIG. 1.

FIG. 2 shows a computer assembly 40 which includes, among other things, a cabinet assembly 42 and computer equipment 44 (shown generally by the arrow 44). Preferably, the computer assembly 40 further includes input/output (I/O) circuitry 46 such as a small control panel 46 (e.g., LEDs and/or buttons) which allow a user to monitor and/or operate the computer equipment 44 (e.g., observe operations, startup and/or shutdown the computer assembly 40, etc.).

The cabinet assembly 42 includes a cabinet 48, a fan assembly 50, and the apparatus 20 of FIG. 1. By way of example only, the fan assembly 50 is located at the top of the cabinet 48, and includes six fans arranged in a 2×3 array. The apparatus 20 rests on the top of the cabinet 48 over the fan assembly 50. In particular, the set of positioning members 24 (e.g., a set of metal alignment posts, also see FIG. 1) properly positions and holds the frame 22 of the apparatus 20 securely on the top of the cabinet 48.

The cabinet 48 includes an airflow pathway 54 (shown generally as the large arrow 54) that runs through the cabinet 48 along a direction 32 (also see FIG. 1). When the computer assembly 40 is an operation, the fan assembly 50 provides an air stream 56 (shown generally as multiple small arrows 56 in FIG. 2) that runs in the direction 32 of the airflow pathway 54. When the fan assembly 50 operates, the fan assembly 50 generates noise energy 58 (shown generally as curves 58) which emanates from the top of the cabinet 48.

It should be understood that the components of the computer assembly 40 can include other features. For example, the doors and/or sides of the cabinet 48 can define multiple air holes 60 which allow air to enter the cabinet 48. As another example, the cabinet assembly 42 can include a set of wheels 62 which raise the cabinet 48 above the floor in order to allow air to enter the cabinet through the bottom of the cabinet 48, and to allow the computer assembly 40 to be moved conveniently around on a floor. Further details of the invention will now be provided with reference to FIG. 3.

Figure 3:
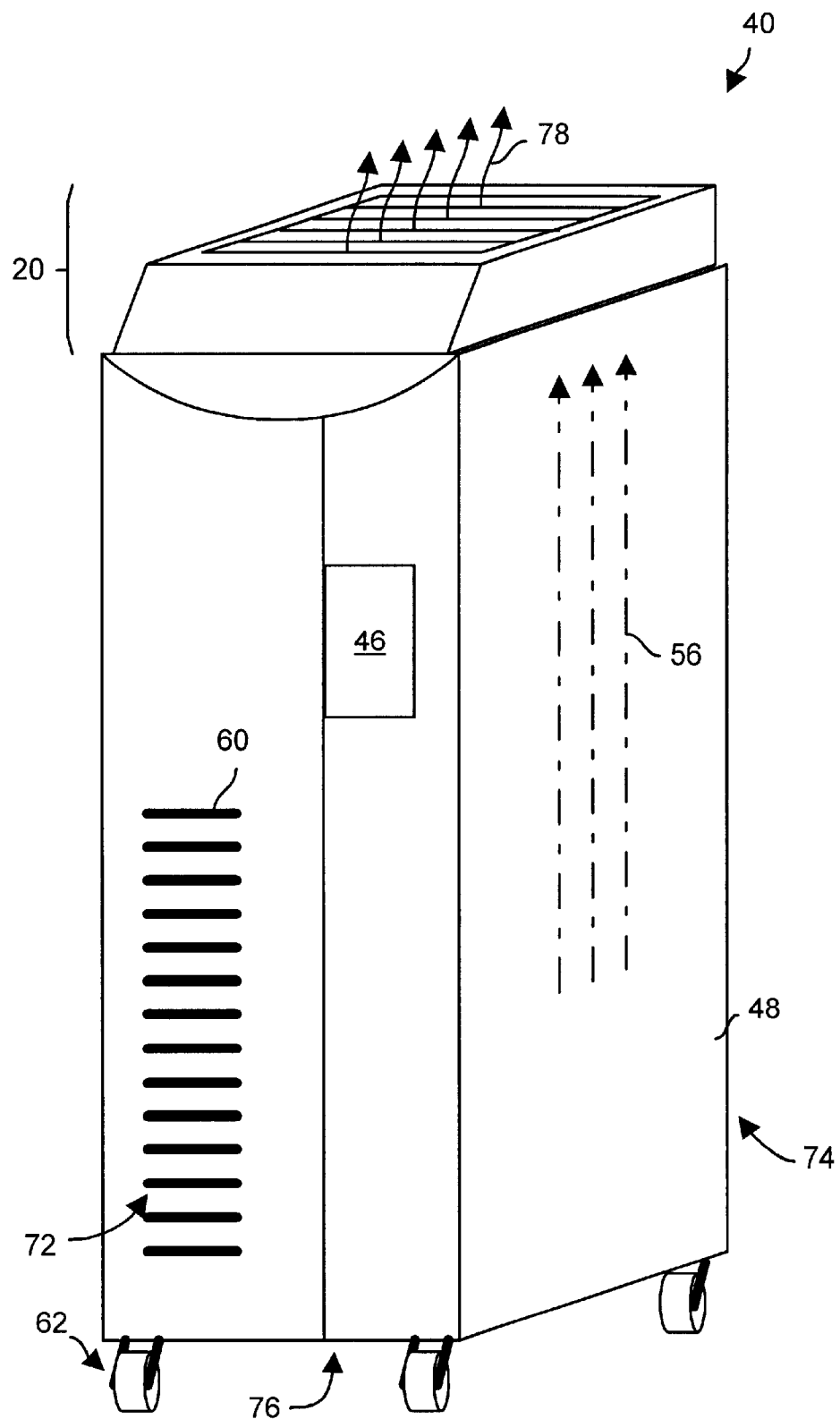
FIG. 3 shows a perspective view of the computer assembly of FIG. 2 when the apparatus is installed.

FIG. 3 shows the computer assembly 40 when the apparatus 20 is properly installed on top of the cabinet 48. When the computer assembly 40 is in operation, the fan assembly 50 generates the air stream 56 (illustrated by the dashed arrows 56) in the direction 32 of the airflow pathway 54 (see FIG. 2) in order to cool the computer equipment 44 stored within the cabinet 48. The fan assembly 50 draws air through air holes (e.g., air holes 60) in the front and back of the cabinet 48 (see arrows 72 and 74) and through the bottom of the cabinet 48 (see arrow 76). The air from the generated air stream 56 passes through the apparatus 20 (see arrows 78) thus removing heat from the operating computer equipment 44. Sound energy 58 emanating from the fan assembly 50 is absorbed the apparatus 20 (see FIGS. 1 and 2) thus providing ear protection for people in the vicinity of the computer assembly 40. Further details of the invention will now be provided with reference to FIG. 4.

Figure 4:
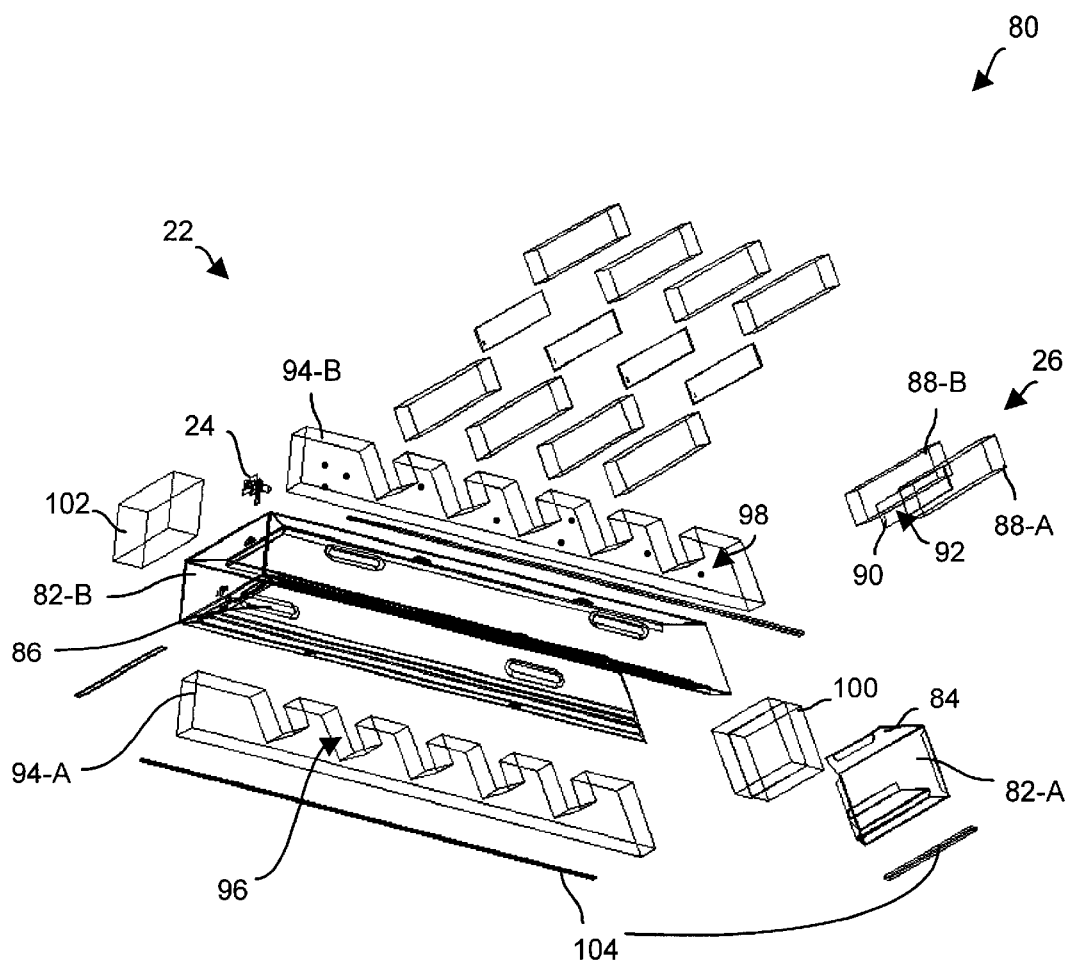
FIG. 4 shows an exploded view of the apparatus of FIG. 1.

FIG. 4 shows an exploded view 80 of the apparatus 20. As shown, the frame 22 includes a front portion 82-A and a back portion 82-B. Preferably, the front and back portions 82-A, 82-B are made of lightweight aluminum (e.g., 0.04 inch thick aluminum) and are welded together to form the frame 22. The lightweight aluminum makes the apparatus 20 lighter and easier to lift and install than the earlier-described conventional muffling device having the steel housing. Furthermore, the lightweight aluminum is less expensive than steel and thus reduces the cost of the apparatus 20 relative to the conventional muffling device.

The front and back portions 82-A, 82-B of the frame 22 include flaps 84 (e.g., return flanges) to retain noise absorption members (e.g., the lateral noise absorption members 26) within the frame 22, and to make the frame 22 more rigid. Preferably, the back portion 82-B defines a set of indentations 86 that can be used as handles by a user in order to grip and hold the apparatus 20. As further shown in the exploded view 80, each positioning member 24 fastens to (e.g., clips to, screws to, etc.) the back portion 82-B of the frame 22. Preferably, each positioning member 24 includes an alignment post that mates with a corresponding hole in the cabinet 48 (see FIGS. 2 and 3) in order to properly align the apparatus 20 with the cabinet 48.

As further shown in the exploded view 80 of FIG. 4, each lateral noise absorption member 26 includes a pair of rectangular-shaped foam portions 88-A, 88-B and a flexible support member 90 (e.g., a strip of flexible lightweight aluminum). The rectangular shapes of the foam portions 88 are easy and efficient to cut (e.g., there are no difficult angle cuts) thus enabling the task of manufacturing the foam portions 88 to remain simple and inexpensive.

An adhesive 92 (e.g., a pressure sensitive adhesive) resides on the front and back surfaces of each flexible support member 90 in order to hold the foam portions 88-A, 88-B in place to form a lateral noise absorption member 26. The flexible support members 90 provide support for the foam portions 88 but enable the lateral noise absorption members 26 to bend for easy installation within the frame 22. The foam portions 88-A which face away from the fan assembly 50 and form the top of the apparatus 20 help absorb noise energy that is reflected from the foam portion 88-B of another lateral noise absorption member 26. Accordingly, noise energy that is reflected by the lateral noise absorption members 26 can be absorbed by other later noise absorption members 26 rather than be allowed to escape.

The apparatus 20 includes additional components that reduce noise leakage through and around the apparatus 20. For example, the apparatus 20 further includes a pair of longitudinal noise absorption members 94-A, 94-B. Each longitudinal noise absorption member 94 defines a set of slots 96 for holding the ends of the lateral noise absorption members 26. The flexible support members 90 of the lateral noise absorption members 26 enable the lateral noise absorption members 26 to bend easily and install between slots 96 of the longitudinal noise absorption members 94.

In one arrangement, the slots 96 preferably position the lateral noise absorption members 26 so that there is clearance between the lower edges of the lateral noise absorption members 26 and the bottom edge of the frame 22 in order to allow check valve flaps of the fan assembly 50 (see FIGS. 4 and 2) to open when the apparatus 20 sits on top of the cabinet 48.

Preferably, the surfaces 28 of the lateral noise absorption members 26 are flat in order to absorb sound energy but not to impede airflow through the apparatus 20. In one arrangement, each longitudinal noise absorption member 94 includes a flat foam portion that provides a similar flat surface (e.g., an embossed foam surface) that forms portions of the airflow channels 30 of the apparatus 20 (also see FIG. 1). In another arrangement, each longitudinal noise absorption member 94 includes a foam portion having a dimpled surface 98 (e.g., a convoluted foam surface) rather than a flat surface. The dimpled surface 98 enables the foam portions the longitudinal noise absorption members 94 to better absorb low-frequency noise compared to flat foam portions. Accordingly, when the longitudinal noise absorption members 94 have dimpled foam portions and when the lateral noise absorption members 26 have flat foam portions, the longitudinal noise absorption members 94 have an increased capability to absorb low-frequency noise energy over that of the lateral noise absorption members 26.

The apparatus 20 further includes a lateral front absorption member 100 (e.g., a pair of flat-surfaced foam portions) and a lateral rear absorption member 102 (e.g., another flat-surfaced foam portion). The apparatus 20 further includes a set of felt strips 104 which fasten along the edges of the frame 22. The front and rear members 100, 102 and the felt strips 104 enhance the noise attenuation properties of the apparatus 20 by reducing noise leakage through and around the apparatus 20. Further details of the invention will now be provided with reference to FIG. 5.

Figure 5:
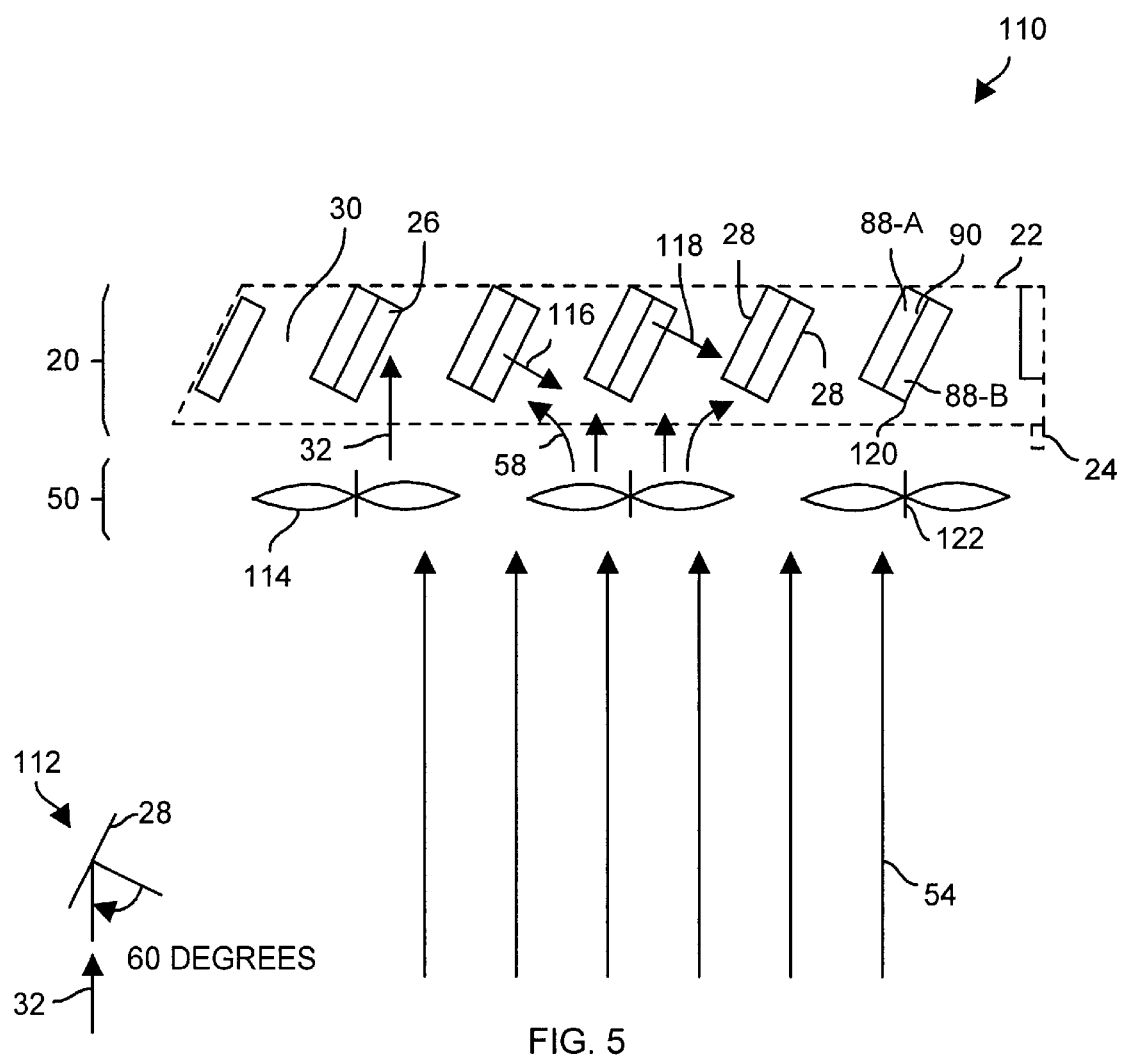
FIG. 5 shows a cross-sectional side view particular components of the computer assembly of FIG. 3.

FIG. 5 shows a cross-sectional side view 110 of particular components of the computer assembly 40, namely the apparatus 20 and the fan assembly 50, when the apparatus 20 is properly installed over the fan assembly 50. As shown, the sides 28 of the lateral noise absorption members 26 of the apparatus 20 form the sides of airflow channels 30 through the apparatus. The lateral noise absorption members 26 are oriented at an angle, in a non-parallel manner, relative to the direction 32 of the airflow pathway 54 through the cabinet 48 (shown simply as arrows 54 in FIG. 5, also see FIG. 3). In particular, the lateral noise absorption members 26 are oriented at substantially 30 degrees to the direction 32 of the airflow pathway 54. This orientation allows for sufficient airflow through the channels 30 and does not adversely affect the cooling capability of the air stream.

Due to this orientation, the lateral noise absorption members 26 have an improved angle of incidence, as shown in the diagram 112 (e.g., substantially 60 degrees), for absorption of sound energy 58 traveling in the direction 32 of the airflow pathway 54. That is. although the sound energy 58 may tend to emanate in all directions from each fan 114 as illustrated by the arrows 58, a major component of the sound energy 58 along the direction 32 strikes the foam surfaces 28 of the lateral noise absorption members 26 and is converted into low level heat which is then removed via the air stream generated by the fan assembly 50. The improved angle of incidence provides superior sound energy absorption to that of the above-described conventional muffling device which has grid of fiberglass padding that defines sets of flat sides which run parallel to the direction of the airflow pathway through the cabinet.

It should be understood that the apparatus 20 does not absorb all of the sound energy 58. Rather, some of the sound energy 58 penetrates the lower foam portions 88-B, strikes the support members 90 and reflects back. This reflected sound energy is then either absorbed by the lower foam portions 88-B on its way back or escapes. As shown in FIG. 5. some of the escaping sound energy 116 is reflected back to the source, i.e., the fan assembly 50. Furthermore, some of the sound energy 118 is absorbed by the upper foam portions 88-A and converted into low level heat. Accordingly, a substantial amount of the sound energy 58 can be absorbed by the apparatus 20 or reflected back rather than be allowed to escape from the computer assembly 40.

It should be understood that the longitudinal noise absorption members 94 (see FIG. 4) position the lateral noise absorption members 26 such that an edge 120 of each lateral noise absorption member 26 resides over an axis of rotation 122 of at least one fan 114. That is, the centerlines of the fans 114 align with the lower corner edges 122 of the lateral noise absorption members 26. This placement of the lateral noise absorption member edges 120 over the axes of rotation 122 of the fans 114 results in very little disruption of the airflow provided by the fans 114 in order to avoid substantially interfering with the air stream.

In one arrangement, the edges 120 of the lateral noise absorption members 26 are not flush with the bottom of the frame 22. Rather, the edges 120 of the lateral noise absorption members 26 are slightly above the bottom of the frame 22 (e.g., approximately one inch higher) so that there is clearance between the edges 122 and the bottom of the frame 22 in order to allow check valves of the fan assembly 50 to properly open when the apparatus 20 sits on top of the cabinet 48.

It should be further understood that the apparatus 20 can (i) provide as much surface area for noise absorption as the earlier-described conventional muffling device having a grid of fiberglass padding that defines sets of flat sides which run parallel to the direction of the airflow pathway through the cabinet, but (ii) have a lower height profile since the lateral noise absorption members 26 are oriented at an angle, e.g., substantially 30 degrees to the airflow direction 32 (rather than parallel to the airflow direction as with the conventional muffling device). Accordingly, the apparatus 20 (i) imposes less ceiling height restrictions than the conventional muffling device, and (ii) can be more aesthetically pleasing to the eye. Further details of the invention will now be provided with reference to FIG. 6.

Figure 6:
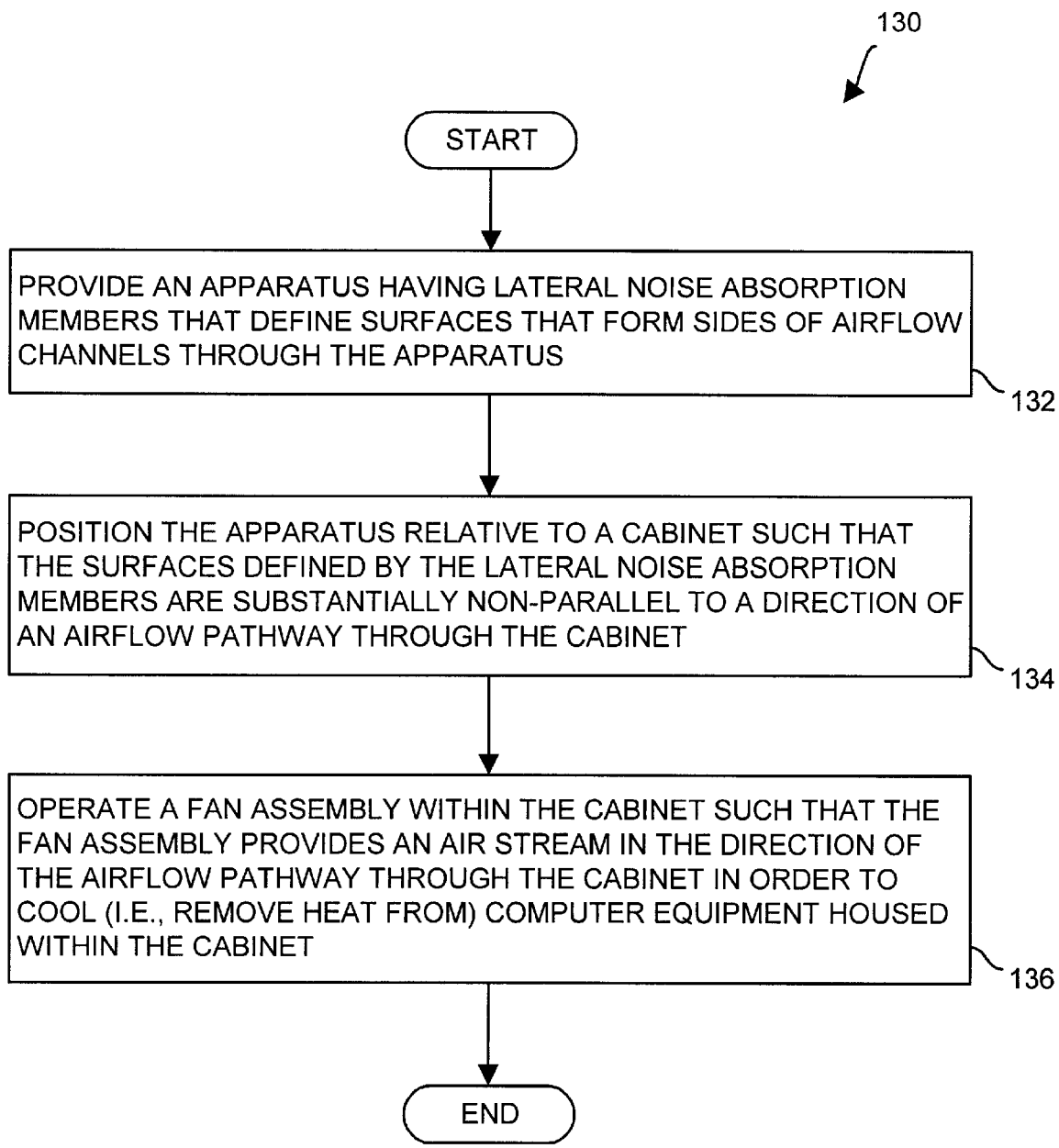
FIG. 6 shows a flowchart of a procedure which is performed by a user of the apparatus of FIG. 1.

FIG. 6 shows a procedure 130 which is performed by a user to attenuate noise emanating from the computer assembly 40 using the apparatus 20. In step 132, the user provides the apparatus 20 which has lateral noise absorption members 26 that defines surfaces 28 that form sides of airflow channels 30 through the apparatus 20 (also see FIG. 5).

In step 134, the user positions the apparatus 20 relative to the cabinet 48 of the computer assembly 40 such that the surfaces 28 defined by the lateral noise absorption members are substantially non-parallel to the direction 32 of the airflow pathway 54 through the cabinet 48. In particular, as shown in FIGS. 2 and 3, the user places the apparatus 20 on top of the cabinet 48 such that the set of positioning members 24 properly position the apparatus 20 over the fan assembly 50.

In step 136, the user operates the fan assembly 50 within the cabinet 48 such that the fan assembly 50 provides an air stream 56 (see FIG. 2) in the direction 32 of the airflow pathway 54 through the cabinet 48 in order to cool (i.e., removed heat from) computer equipment 44 housed within the cabinet 48. That is, the user operates the computer assembly 40 and allows the apparatus 20 to attenuate noise emanating from the fan assembly 50. Accordingly, the lateral noise absorption members 26 reduce the noise energy 58 emanating from the fan assembly 50 (e.g., a 75% reduction in noise energy). The lateral noise absorption members 26 transform some of the noise into low level heat which can be dissipated into the air stream 56. Additionally, some of noise is reflected back into the cabinet 48 toward the source, i.e., the fan assembly 50.

As described above, the invention is directed to techniques for attenuating sound energy 58 from a cabinet 48 that houses computer equipment 44 using lateral noise absorption members 26 which define surfaces 28 that form sides of airflow channels 30. The surfaces 28 are substantially non-parallel to a direction 32 of an airflow pathway 54 through the cabinet 48 when the lateral noise absorption members 26 are properly installed with the cabinet 48. The invention provides more surface area (proportionately to height) and an improved angle of incidence for absorbing the sound energy 58 than the above-described conventional fiberglass padded device having flat sides that run parallel to the direction of the airflow pathway. Accordingly, the invention can provide substantial ear protection particularly to people in the vicinity of the cabinet who do not have the benefit of other ear protection (e.g., earplugs, headphones, etc.). The features of the invention, may be employed in computer systems, assemblies and procedures such as those of EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, the fan assembly 50 and the apparatus 20 were shown as residing at the top of the cabinet 48 (see FIGS. 2 and 3) by way of example only. It should be understood that other locations for the fan assembly and the apparatus 20 are suitable as well. For example, the fan assembly 50 could be located at the bottom of the cabinet 48 rather than the top and push (rather than draw) air through the cabinet 48. As another alternative, the fan assembly 50 could be oriented such that the direction of airflow through the cabinet 48 is sideways. In such alternative arrangements, the apparatus 20 can be positioned in alternative locations (e.g., on the side or bottom) to attenuate sound energy 58 escaping from the alternatively configured and/or located fan assembly 50.

Additionally, it should be understood that the angle of incidence was shown as being substantially 60 degrees by way of example only. It should be understood that other angles are suitable as well. In particular, angles that are substantially non-parallel to the direction 32 of the airflow pathway 54 (e.g., 30 degrees, 45 degrees, or other angles in ranging between 10 degrees to 80 degrees) greatly facilitate noise absorption by the lateral noise absorption members 26 of the apparatus 20.

Additionally, it should be understood that the fan assembly 50 was described as having a 2×3 array of fans by way of example only. Other fan configurations are suitable as well such as a single large fan, two fans, etc.

Furthermore, it should be understood that the noise absorption members 26, 94, 100, 102 (see FIG. 4) where described as including foam portions by way of example only. Foam portions are well suited for the apparatus 20 due to their noise absorption properties, low cost, and easy handling attributes. In particular, foam can be easily cut and shaped (e.g., cut into rectangular portions, cut in order to define slots 96 as shown in FIG. 4, etc.) with little mess and waste thus keeping manufacturing costs minimal. Nevertheless, other materials are also suitable for use as well such as cotton, styrofoam, fiberglass, any combinations thereof, and the like.

What is claimed is:

1. An apparatus for attenuating noise from a cabinet that houses computer equipment, the apparatus comprising:
   a frame;
   a set of positioning members to position the frame relative to the cabinet; and
   lateral noise absorption members that are supported by the frame, wherein the lateral noise absorption members define surfaces that form sides of airflow channels through the apparatus, the surfaces being substantially non-parallel to a direction of an airflow pathway through the cabinet when the set of positioning members positions the frame relative to the cabinet, wherein the frame supports the lateral noise absorption members such that an edge of each lateral noise absorption member resides over an axis of rotation of at least one fan within the cabinet when the set of positioning members positions the frame relative to the cabinet.

2. The apparatus of claim 1 wherein the lateral noise absorption members include respective foam portions to absorb noise energy exiting the cabinet in the direction of the airflow pathway when the set fo positioning members positions the frame relative to the cabinet.

3. The apparatus of claim 2, further comprising:
   longitudinal noise absorption members that extend in a direction that is perpendicular to the lateral noise absorption members, wherein each longitudinal noise absorption member defines slots that hold the lateral noise absorption members in position.

4. The apparatus of claim 2 wherein the foam portion of each lateral noise absorption member defines a substantially flat surface, and wherein the apparatus further comprises:
   longitudinal noise absorption members that extend in a direction that is perpendicular to the lateral noise absorption members. wherein the longitudinal noise absorption members include respective foam portions, and wherein the foam portion of each longitudinal noise absorption member defines a substantially dimpled surface.

5. The apparatus of claim 2, further comprising:
   longitudinal noise absorption members that extend in a direction that is perpendicular to the lateral noise absorption members, wherein the longitudinal noise absorption members include respective foam portions, and wherein the foam portions of the longitudinal noise absorption members have an increased capability to absorb low frequency noise energy over that of the foam portions of the lateral noise absorption members.

6. The apparatus of claim 1 wherein each lateral noise absorption member includes:
   a foam portion;
   a metallic support portion; and
   adhesive that fastens the foam portion to the metallic support portion of that lateral noise absorption member.

7. The apparatus of claim 1 wherein each lateral noise absorption member further includes:
   another foam portion; and
   additional adhesive that fastens the other foam portion to another side of the metallic support portion of that lateral noise absorption member.

8. The apparatus of claim 1, further comprising:
   longitudinal members that orient the lateral noise absorption members such that the surfaces defined by the lateral noise absorption members reside at substantially 30 degrees to the direction of the airflow pathway through the cabinet when the set of positioning members positions the frame relative to the cabinet.

9. The apparatus of claim 1 wherein the set of positioning members includes multiple alignment posts which fasten to the frame, and wherein the multiple alignment posts extend from the frame in a downward direction toward the cabinet when the set of positioning members positions the frame relative to the cabinet.

10. The apparatus of claim 9 wherein each of the multiple alignment posts is configured to insert into a respective portion of the cabinet when the set of positioning members positions the frame relative to the cabinet.

11. A computer cabinet assembly, comprising:
   a cabinet to house computer equipment;
   a fan assembly disposed within the cabinet, the fan assembly being capable of providing an air stream in a direction of an airflow pathway through the cabinet; and an apparatus to attenuate noise from the cabinet, the apparatus including:
   a frame,
   a set of positioning members to position the frame relative to the cabinet, and
   lateral noise absorption members that are supported by the frame, wherein the lateral noise absorption members define surfaces that form sides of airflow channels through the apparatus, the surfaces being substantially non-parallel to the direction of the airflow pathway through the cabinet when the set of positioning members positions the frame relative to the cabinet,
   wherein the fan assembly includes multiple fans, and wherein the frame of the apparatus supports the lateral noise absorption members such that an edge of each lateral noise absorption member resides over an axis of rotation of at least one fan of the fan assembly disposed within the cabinet when the set of positioning members positions the frame relative to the cabinet.

12. The computer cabinet assembly of claim 11 wherein the lateral noise absorption members of the apparatus include respective foam portions to absorb noise energy exiting the cabinet in the direction of the airflow pathway when the set of positioning members positions the frame of the apparatus relative to the cabinet.

13. The computer cabinet assembly of claim 12 wherein the apparatus further includes:
   longitudinal noise absorption members that extend in a direction that is perpendicular to the lateral noise absorption members, wherein each longitudinal noise absorption member defines slots that hold the lateral noise absorption members in position.

14. The computer cabinet assembly of claim 12 wherein the foam portion of each lateral noise absorption member defines a substantially flat surface, and wherein the apparatus further includes:
   longitudinal noise absorption members that extend in a direction that is perpendicular to the lateral noise absorption members, wherein the longitudinal noise absorption members include respective foam portions, and wherein the foam portion of each longitudinal noise absorption member defines a substantially dimpled surface.

15. The computer cabinet assembly of claim 12 wherein the apparatus further includes:
   longitudinal noise absorption members that extend in a direction that is perpendicular to the lateral noise absorption members, wherein the longitudinal noise absorption members include respective foam portions, and wherein the foam portions of the longitudinal noise absorption members have an increased capability to absorb low frequency noise energy over that of the foam portions of the lateral noise absorption members.

16. The computer cabinet assembly of claim 11 wherein each lateral noise absorption member of the apparatus includes:
   a foam portion;
   a metallic support portion; and
   adhesive that fastens the foam portion to the metallic support portion of that lateral noise absorption member.

17. The computer cabinet assembly of claim 16 wherein each lateral noise absorption member of the apparatus further includes:
   another foam portion; and
   additional adhesive that fastens the other foam portion to another side of the metallic support portion of that lateral noise absorption member.

18. The computer cabinet assembly of claim 11 wherein the apparatus further includes:
   longitudinal members that orient the lateral noise absorption members such that the surfaces defined by the lateral noise absorption members reside at substantially 30 degrees to the direction of the airflow pathway through the cabinet when the set of positioning members positions the frame relative to the cabinet.

19. The computer cabinet assembly of claim 11 wherein the set of positioning members of the apparatus includes multiple alignment posts which fasten to the frame of the apparatus, and wherein the multiple alignment posts extend from the frame in a downward direction toward the cabinet when the set of positioning members positions the frame relative to the cabinet.

20. The computer cabinet assembly of claim 19 wherein each of the multiple alignment posts is configured to insert into a respective portion of the cabinet when the set of positioning members positions the frame relative to the cabinet.

21. A computer assembly, comprising:
   computer equipment to perform computerized operations; and
   a cabinet assembly having (i) a cabinet to house the computer equipment, (ii) a fan assembly disposed within the cabinet, the fan assembly being capable of providing an air stream in a direction of an airflow pathway through the cabinet in order to cool the computer equipment, and (iii) an apparatus to attenuate noise from the cabinet, the apparatus including:
      a frame,
      a set of positioning members to position the frame relative to the cabinet, and
      lateral noise absorption members that are supported by the frame, wherein the lateral noise absorption members define surfaces that form sides of airflow channels through the apparatus, the surfaces being substantially non-parallel to the direction of the airflow pathway through the cabinet when the set of positioning members positions the frame relative to the cabinet, and
      wherein the fan assembly includes multiple fans, and wherein the frame of the apparatus supports the lateral noise absorption members such that an edge of a lateral noise absorption member resides over an axis of rotation of a corresponding fan of the fan assembly disposed within the cabinet when the set of positioning members positions the frame relative to the cabinet.

22. A method for attenuating noise from a cabinet that houses computer equipment, the method comprising the steps of:
   providing an apparatus having lateral noise absorption members that define surfaces that form sides of airflow channels through the apparatus;
   positioning the apparatus relative to the cabinet such that the surfaces defined by the lateral noise absorption members are substantially non-parallel to a direction of an airflow pathway through the cabinet, and such that an edge of each lateral noise absorption member resides over an axis of rotation of at least one fan of a fan assembly disposed within the cabinet; and
   operating the fan assembly within the cabinet such that the fan assembly provides an air stream in the direction of the airflow pathway through the cabinet in order to cool the computer equipment housed within the cabinet.

23. An apparatus for attenuating noise from a cabinet that houses computer equipment, the apparatus comprising:
   a frame;
   a set of positioning members to position the frame relative to the cabinet; and
   lateral noise absorption members that are supported by the frame, wherein the lateral noise absorption members define surfaces that form sides of airflow channels through the apparatus, the surfaces being substantially non-parallel to a direction of an airflow pathway through the cabinet when the set of positioning members positions the frame relative to the cabinet, wherein the frame supports the lateral noise absorption members such that an edge of a lateral noise absorption member resides over an axis of rotation of a corresponding fan within the cabinet when the set of positioning members positions the frame relative to the cabinet.

* * * * *